(12) United States Patent
Choi

(10) Patent No.: US 8,039,387 B2
(45) Date of Patent: Oct. 18, 2011

(54) SEMICONDUCTOR DEVICE AND METHOD FOR MANUFACTURING THE SAME

(75) Inventor: Chee-Hong Choi, Gwangjin-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 243 days.

(21) Appl. No.: 12/326,905

(22) Filed: Dec. 3, 2008

(65) Prior Publication Data

US 2009/0140303 A1 Jun. 4, 2009

(30) Foreign Application Priority Data

Dec. 3, 2007 (KR) .................. 10-2007-0124507

(51) Int. Cl.
*H01L 21/4763* (2006.01)

(52) U.S. Cl. .. 438/622; 438/637; 257/758; 257/E21.575

(58) Field of Classification Search .................. 257/758, 257/E23.168, 618, 620, E23.194, E23.145; 438/622, 637, 424, 639, 618, 132, 118, 199–201
See application file for complete search history.

(56) References Cited

U.S. PATENT DOCUMENTS

| | | | |
|---|---|---|---|
| 6,881,597 B2 * | 4/2005 | Asayama et al. | 438/18 |
| 7,692,274 B2 * | 4/2010 | Chen et al. | 257/620 |
| 2002/0024115 A1 * | 2/2002 | Ibnabdeljalil et al. | 257/620 |
| 2002/0153611 A1 * | 10/2002 | Nakanishi | 257/758 |
| 2005/0073052 A1 * | 4/2005 | Mori et al. | 257/758 |
| 2005/0161822 A1 * | 7/2005 | Ohkubo et al. | 257/758 |
| 2005/0161831 A1 * | 7/2005 | Nakamura | 257/774 |
| 2005/0173773 A1 * | 8/2005 | Kim | 257/431 |
| 2006/0103017 A1 * | 5/2006 | Usui et al. | 257/725 |
| 2006/0264034 A1 * | 11/2006 | Endo et al. | 438/637 |
| 2007/0145589 A1 * | 6/2007 | Kim | 257/758 |
| 2007/0246796 A1 * | 10/2007 | Guo et al. | 257/529 |
| 2008/0017991 A1 * | 1/2008 | Kim | 257/773 |
| 2008/0131991 A1 * | 6/2008 | Kim | 438/70 |

FOREIGN PATENT DOCUMENTS

| | | |
|---|---|---|
| KR | 10-1998-066710 | 10/1998 |
| KR | 2003050953 A * | 6/2003 |
| KR | 10-2006-0016981 | 2/2006 |

\* cited by examiner

*Primary Examiner* — Matthew Landau
*Assistant Examiner* — Latanya N Crawford
(74) *Attorney, Agent, or Firm* — Sherr & Vaughn, PLLC

(57) ABSTRACT

A semiconductor device and a method for manufacturing the same includes forming a via pattern having a matrix form in a dielectric layer. The via pattern includes a via slit provided at the center of the via pattern and a plurality of via holes provided at an outer periphery of the via pattern and surrounding the via slit. Metal plugs are formed in the via holes.

14 Claims, 6 Drawing Sheets

SEMICONDUCTOR DEVICE AND METHOD FOR MANUFACTURING THE SAME

The present application claims priority under 35 U.S.C. §119 to Korean Patent Application No. P10-2007-0124507 (filed on Dec. 3, 2007) which is hereby incorporated by reference in its entirety.

BACKGROUND

Fluorine, which is used in the fabrication of semiconductor devices, serves to lower a dielectric constant of a thin oxidized layer and restrict an RC time constant delay. This contributes to improvement in the operating speed of a semiconductor device. However, fluorine has a serious effect on the surroundings structure due to its strong reactivity and diffusion and therefore, requires sufficient capping to prevent the above effect. If fluorine deviates from a use region thereof and is exposed to surrounding metals or transistors or the like, it may shift the transistors or cause defects of the transistors due to strong reactivity thereof. Accordingly, diffusion of fluorine may have a serious negative effect on the performance of a semiconductor device due to causing corrosion of surrounding metals. In particular, when fluorine is exposed to metal, metal corrosion or blistering occurs, causing serious deterioration in the production yield and reliability of a semiconductor device.

FIGS. 1A to 1F illustrate depictions explaining blistering generated upon fabrication of a semiconductor device. FIG. 1A illustrates the appearance of a wafer on and/or over which a semiconductor device having a via pattern is formed. FIG. 1B is an enlarged view of FIG. 1A illustrating blisters 10. FIG. 1C is an enlarged view of FIG. 1B illustrating the blisters 10. FIG. 1D is an enlarged view of FIG. 1C illustrating the blisters 10. FIG. 1E is a sectional view of the semiconductor device shown in FIG. 1D. In addition, it will be appreciated from FIG. 1F which is an enlarged view of FIG. 1E that blisters 12 occur above vias 14. The blisters 12 further seriously occur at a region where via patterns are densely formed. More specifically, if fluorine escapes from an interlayer dielectric layer and attacks the surroundings, the blisters 12 occur.

FIGS. 2A and 2B are plan views of a via pattern produced by a method for manufacturing a semiconductor device. FIG. 2B is an enlarged view of FIG. 2A. Referring to FIG. 2B, in a method for manufacturing a semiconductor device, neighboring vias 14 of a via pattern are spaced apart from each other by a constant distance. Accordingly, when the vias 14 are densely formed, blisters may occur.

SUMMARY

Embodiments relate to a semiconductor device and a method for manufacturing the same that prevents blisters from occurring in metals due to degassing of fluorine when plugs are formed using fluorine.

Embodiments relate to a method for manufacturing a semiconductor device that may include at least one of the following: forming an interlayer dielectric layer on and/or over a semiconductor substrate; forming a via pattern including a plurality of via holes each penetrating through the interlayer dielectric layer and at least one via slit to space the neighboring via holes apart from each other; and forming tungsten plugs in the via holes by feeding a tungsten source gas into the via holes.

Embodiments relate to a semiconductor device that may include at least one of the following: an interlayer dielectric layer formed on and/or over a semiconductor substrate; and tungsten plugs formed in a via pattern that penetrates through the interlayer dielectric layer. In accordance with embodiments, the via pattern includes at least one of a via hole region in which a plurality of via holes is formed and at least one via slit to space the neighboring via holes apart from each other by a predetermined distance.

Embodiments relate to a method that may include at least one of the following: forming a first dielectric layer over a semiconductor substrate; and then forming lower metal wiring over the dielectric layer; and then forming a second dielectric layer over the entire surface of the first dielectric layer including the lower metal wiring; and then forming a via pattern including a plurality of via holes penetrating through the second dielectric layer and a via slit to space neighboring via holes apart from each other; and then forming metal plugs in the via holes.

Embodiments relate to a device that may include at least one of the following: a gate pattern formed over a semiconductor substrate; source/drain regions formed at opposite sides of the gate pattern; a dielectric layer formed over the semiconductor substrate including the gate pattern and the source/drain regions; a via pattern including a plurality of via holes penetrating through the dielectric layer and a via slit to space neighboring via holes apart from each other; metal plugs formed in the via holes connected to the gate pattern and the source/drain regions; metal wiring formed over the dielectric layer and electrically connected to the gate pattern and the source/drain regions via the metal plugs.

Embodiments relate to a device that may include at least one of the following: a first dielectric layer formed over a semiconductor substrate; lower metal wiring formed over the first dielectric layer; a second dielectric layer formed over the entire surface of the first dielectric layer including the lower metal wiring; a via pattern formed in the second dielectric layer, the via pattern including a via slit provided at the center of the via pattern and a plurality of via holes provided at an outer periphery of the via pattern and surrounding the via slit; and metal plugs formed in the via holes.

DRAWINGS

Figure 4A:
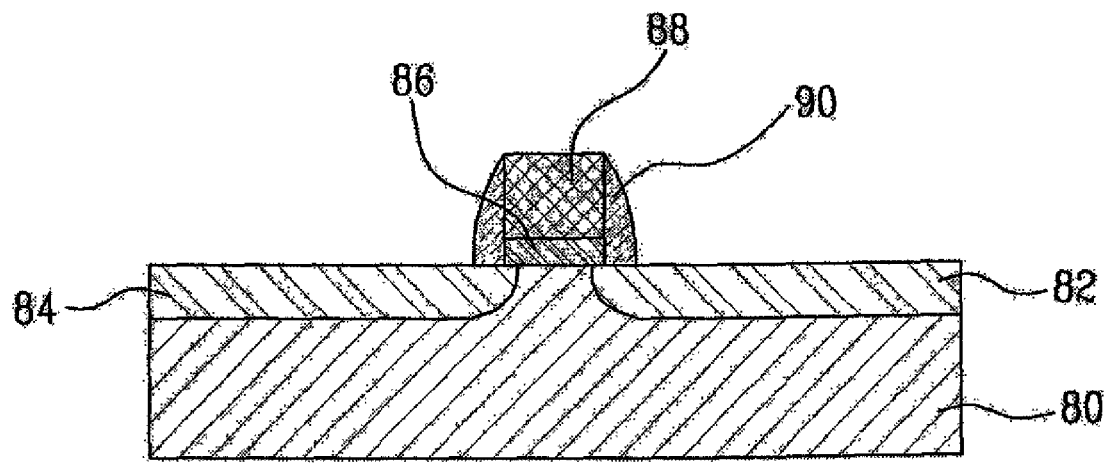
Figure 4B:
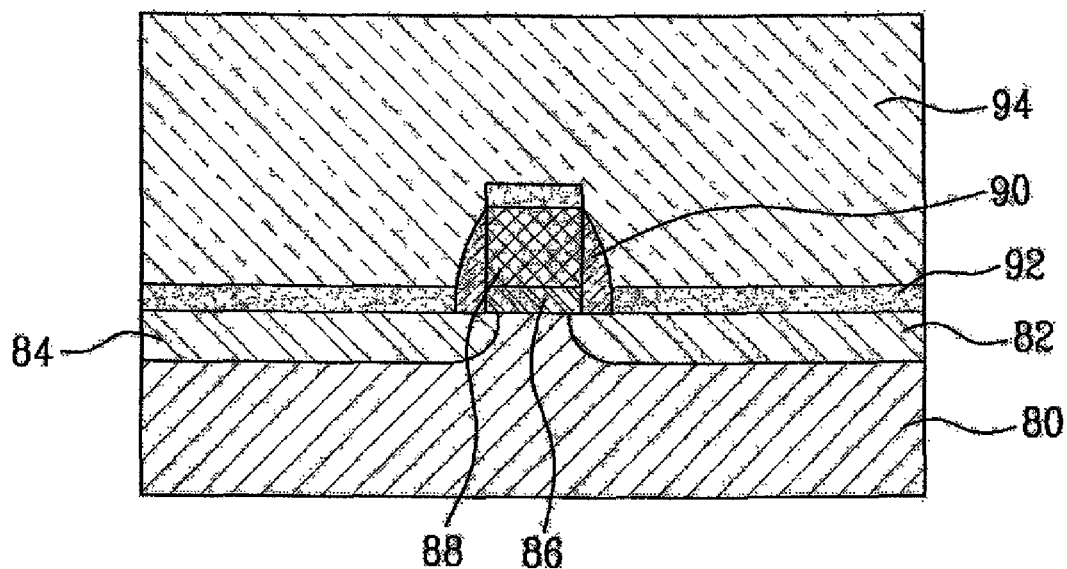
Figure 4C:
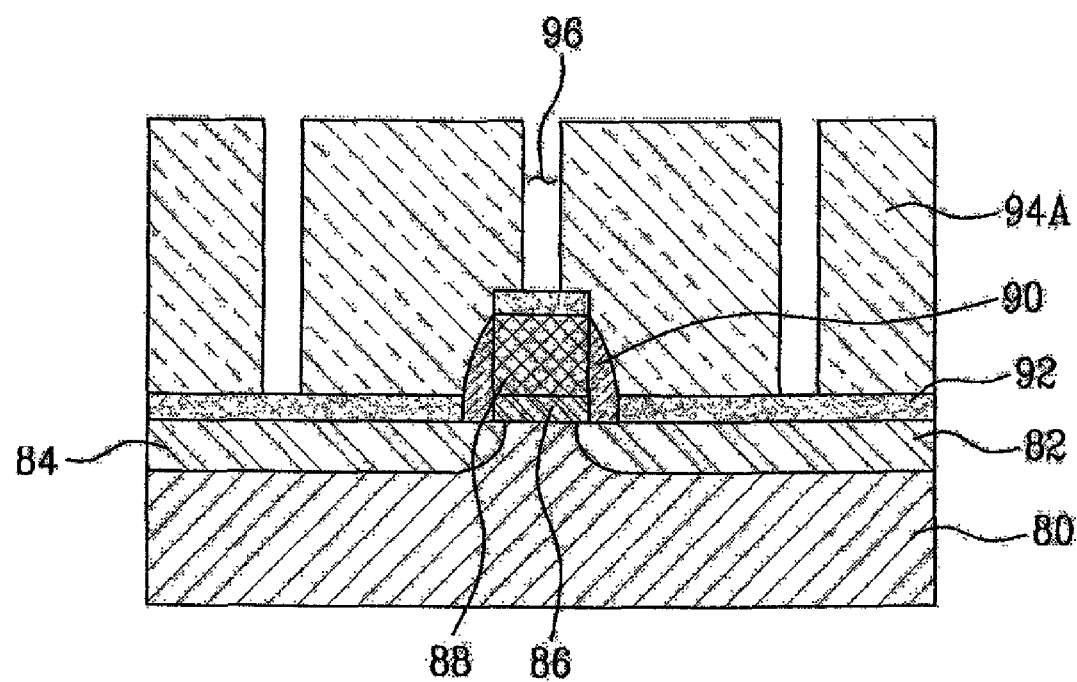
Figure 4D:
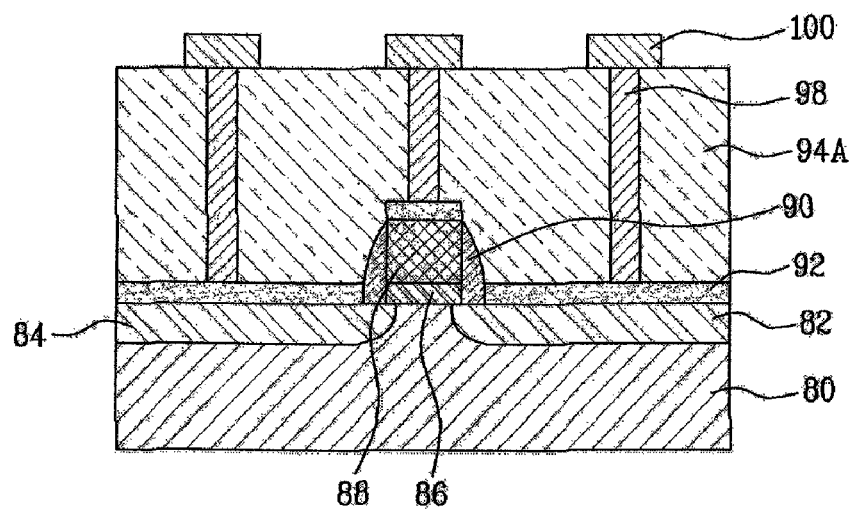
Figure 4E:
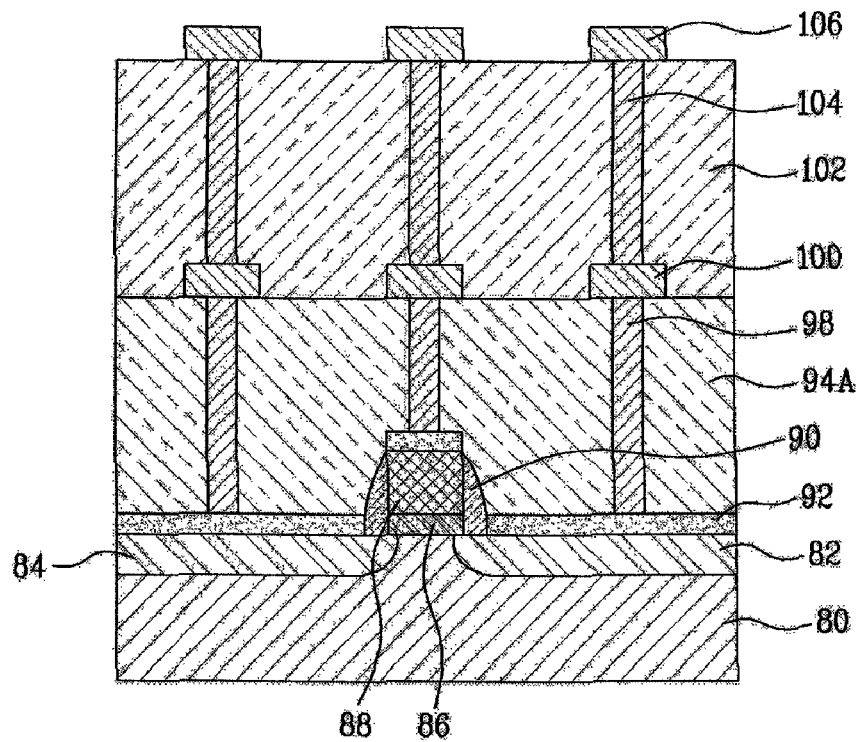
Figure 5:
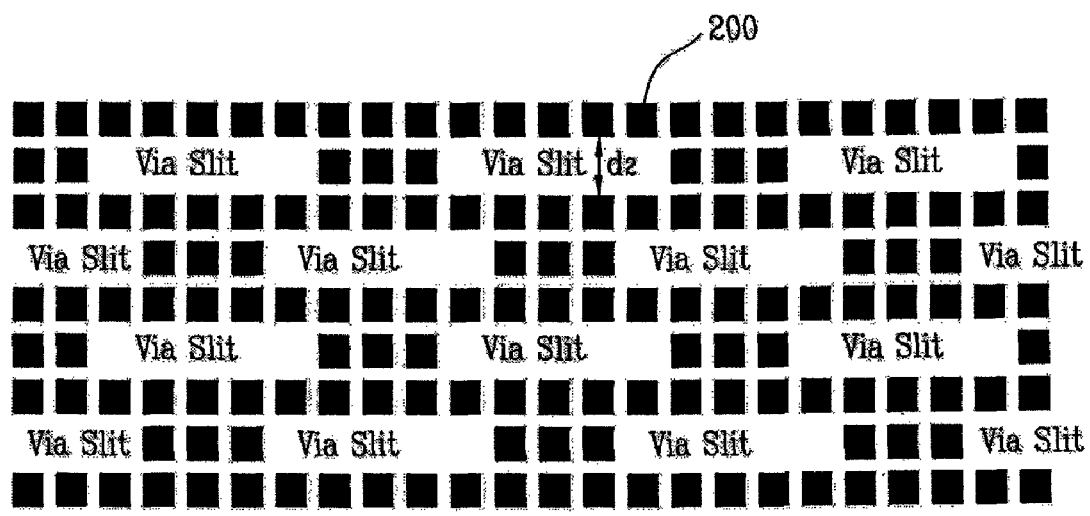

Example FIGS. 3 to 5 illustrate a method for manufacturing a semiconductor device and a semiconductor device in accordance with embodiments.

DESCRIPTION

Example FIGS. 3A to 3D are process sectional views illustrating.

Figure 3A:
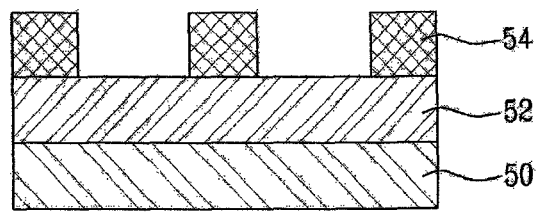

As shown in example FIG. 3A, a method for manufacturing a semiconductor device in accordance with embodiments may include forming a dielectric layer 52 on and/or over a semiconductor substrate 50. A metal layer is then depositing on and/or over the dielectric layer 52 and then patterned, thereby forming a lower metal wiring 54. The lower metal wiring 54 may be made of aluminum or aluminum alloy or the like.

Figure 3B:
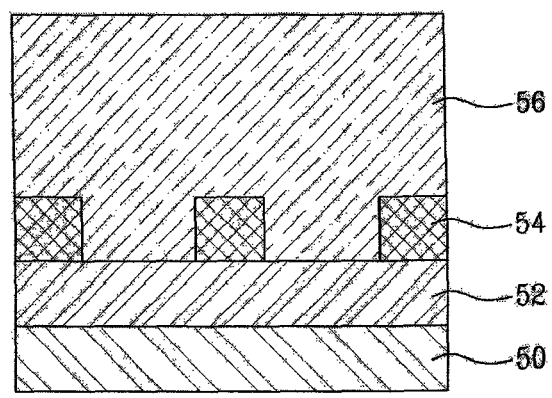

As shown in example FIG. 3B, after formation of the lower metal wiring 54, an interlayer dielectric layer 56 is formed on and/or over the entire surface of the dielectric layer 52 including the lower metal wiring 54. The interlayer dielectric layer 56 may be made of a plurality of dielectric layers. For example, the interlayer dielectric layer 56 may be made of a nitride layer using Physical Vapor Deposition (PVD) or the like.

Figure 3C:
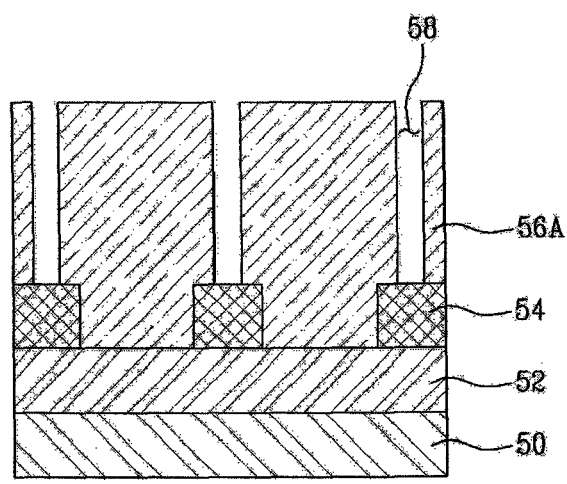

As shown in example FIG. 3C, a via pattern is formed including a plurality of via holes penetrating through the interlayer dielectric layer 56A to expose an associated portion of the lower metal wiring 54. The via pattern further includes at least one via slit configured to space the neighboring via holes 58 apart from each other. Here, the via slit is a space where no via hole is present, and will be exemplified hereinafter.

Figure 3D:
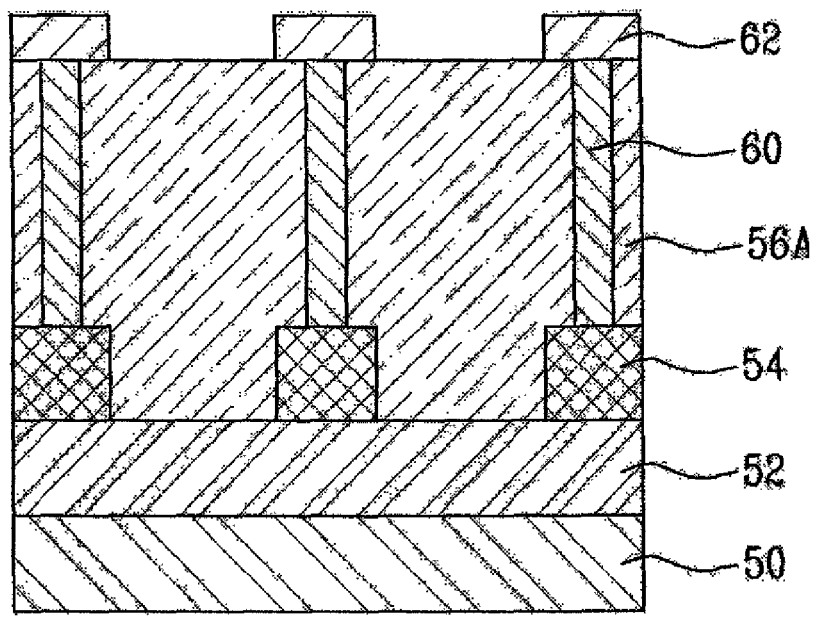

As shown in example FIG. 3D, a tungsten source gas is fed into the via holes 58, forming tungsten plugs 60 in the respective via holes 58. In accordance with embodiments, $WF_6$ may be used as the tungsten source gas. Thereafter, after depositing a metal layer over the tungsten plugs 60, the metal layer is patterned, forming an upper metal wiring 62. The upper metal wiring 62 may be made of aluminum or aluminum alloy or the like. Accordingly, the lower metal wiring 54 and upper metal wiring 62 can be electrically connected with each other via the tungsten plugs 60.

As shown in example FIG. 4A, a method for manufacturing a semiconductor device in accordance with embodiments may include forming a gate pattern on and/or over a semiconductor substrate 80. The gate pattern may include a gate dielectric layer 86 formed on and/or over the semiconductor substrate 80, and a poly-silicon gate 88 formed on and/or over the gate dielectric layer 86. A spacer 90 may be further formed on a sidewall of the gate pattern. Dopant ions are then implanted into the semiconductor substrate 80 using the gate pattern and spacer 90 as a mask, thereby forming source/drain regions 82, 84 at opposite sides of the gate pattern. The source/drain regions 82, 84 may be present below or otherwise overlap the spacer 90 because they are diffusive, but embodiments are not limited thereto.

As shown in example FIG. 4B, an interlayer dielectric layer 94 is formed on and/or over the entire surface of the semiconductor substrate 80 including the gate pattern and source/drain regions 82, 84. In accordance with embodiments, a silicide layer 92 may be further formed on and/or over the gate 88 and the source/drain regions 82, 84 prior to forming the interlayer dielectric layer 94. The interlayer dielectric layer 94 may include a plurality of dielectric layers. For example, the interlayer dielectric layer 94 may be made of a nitride layer using Physical Vapor Deposition (PVD) or the like.

As shown in example FIG. 4C, a via pattern is formed including a plurality of via holes 96 penetrating through the interlayer dielectric layer 94A to expose an associated portion of the silicide layer 92. The via pattern further includes at least one via slit configured to space the neighboring via holes 96 apart from each other.

As shown in example FIG. 4D, a tungsten source gas is fed into the via holes 96, thereby forming tungsten plugs 98 in the respective via holes 96. Thereafter, after depositing a metal layer on and/or over the tungsten plugs 98, the metal layer is patterned, thereby forming a metal wiring 100. Accordingly, the gate 88 of the gate pattern and the source/drain regions 82, 84 can be connected with the metal wiring 100 through the tungsten plugs 98.

As shown in example FIG. 4E, an interlayer dielectric layer 102 is formed on and/or over the metal wiring 100. Via holes are perforated in the interlayer dielectric layer 102, and a tungsten source gas is fed, whereby tungsten plugs 104 are formed. Then, after depositing a metal layer over the tungsten plugs 104, the metal layer is patterned, thereby forming a metal wiring 106. The via pattern for formation of the tungsten plugs 104 may also include at least one via slit. The metal wirings 100, 106 may be made of aluminum or aluminum alloy or the like.

Example FIG. 5 is a plan view of the semiconductor device shown in embodiments illustrating a via pattern as an array of via holes 200. As shown in example FIG. 5, the via pattern includes a via hole region containing a plurality of via holes, and a plurality of via slits. Specifically, the via hole region may be configured such that the plurality of via holes is arranged with a constant distance. Each of the via slits may have a rectangular cross-section and the geometric form (cross-section) of the via hole region can be determined according to the form of the via slit. The via slits may be arranged in a zigzag pattern such that the via slits alternate with each other. For example, via slits of a first row (or a first column) alternate with via slits of a second row (or a second column), representing a zigzag pattern. Meaning, via slits of the neighboring rows (or columns) can be arranged in a zigzag pattern.

Figure 1:
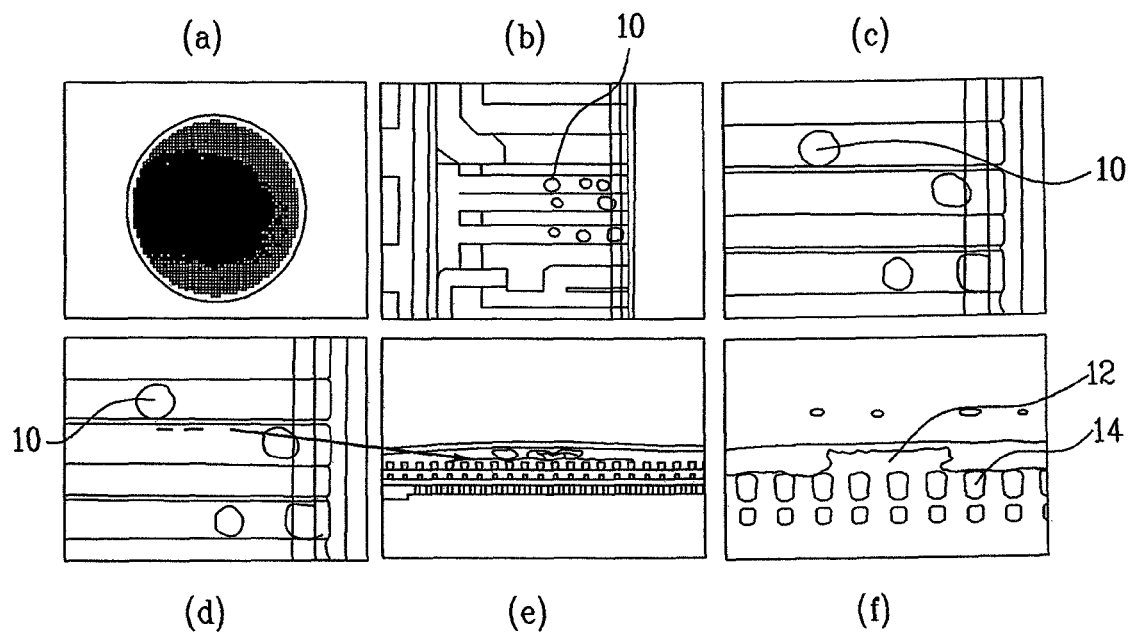
FIGS. 1A to 1F illustrate blistering generated upon fabrication of method for manufacturing a semiconductor device.
Figure 2:
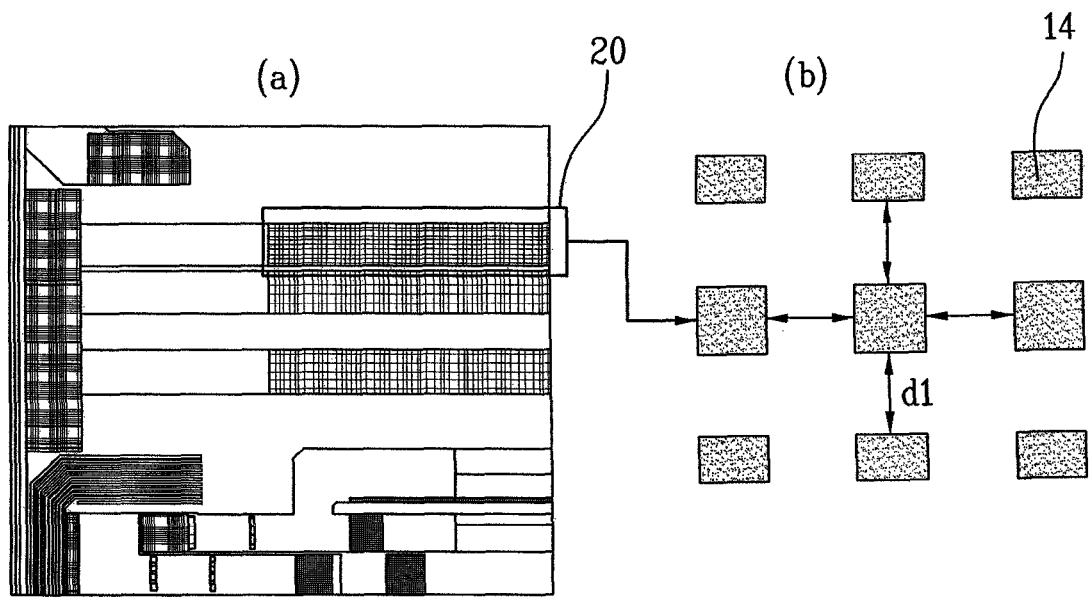
FIGS. 2A and 2B illustrate a via pattern produced by a method for manufacturing a semiconductor device.

As compared to a distance d1 between the via holes 14 in a via pattern shown in FIG. 2B, the via pattern shown in example FIG. 5 is configured such that a distance d2 between via holes 200 is determined according to a dimension of the via slits. Accordingly, in accordance with embodiments, it can be appreciated that the distance d2 between the via holes is greater than the distance d1 between the other via holes, and thus, blistering can be prevented.

With respect to a single via slit, the width of the via slit may be equal to a total width of at least one via hole, and the height of the via slit may be equal to a total height of at least one via hole. In example FIG. 5, although embodiments are not limited thereto, the width of each via slit is equal to a total width of five via holes and the height of the via slit is equal to the height of one via hole. It will be appreciated that any other shapes of via patterns are possible so long as the distance d2 is larger than the distance d1.

Referring to example FIG. 3D, the interlayer dielectric layer 56A is formed on and/or over the dielectric layer 52 and the semiconductor substrate 50. Referring to example FIG. 3C, the plurality of via holes 58 penetrates through the interlayer dielectric layer 56A. In this case, as shown in example FIG. 5, the neighboring via holes 200 are spaced apart from each other by a distance d2 with at least one via slit interposed therebetween. As a tungsten source gas is fed into the via holes of the via pattern, the tungsten plugs 60 are formed in the via holes. The metal wiring 62 is formed on and/or over the tungsten plugs 60.

Referring to FIG. 4E, the interlayer dielectric layer 94A is formed over the entire surface of the semiconductor substrate 80 including the gate pattern and source/drain regions 82, 84. The interlayer dielectric layer 102 is formed on and/or over the interlayer dielectric layer 94A including the metal wiring 100. The plurality of via holes 96 penetrates through the interlayer dielectric layer 94A, and the plurality of via holes penetrates through the interlayer dielectric layer 102. As a tungsten source gas is fed into the via holes of the via pattern, the tungsten plugs 98 and 104 are formed in the via holes.

As apparent from the above description, embodiments provide a semiconductor device and a method for manufacturing the same such that via slits are interposed between neighboring via holes which are densely arranged. The provision of via slits can alleviate or minimize stress due to degassing of fluorine gas, thereby restricting blistering of the semiconductor device and improving the production yield and reliability of the semiconductor device.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    forming a first dielectric layer over a semiconductor substrate; and then
    forming lower metal wiring over the first dielectric layer; and then
    forming a second dielectric layer over the entire surface of the first dielectric layer including the lower metal wiring; and then
    forming a via pattern including a plurality of via holes penetrating through the second dielectric layer and a plurality of via slits to space neighboring via holes apart from each other; and then
    forming metal plugs in the via holes,
    wherein the plurality of via slits are arranged in a zigzag pattern such that the plurality of via slits alternate with each other,
    wherein the via pattern is formed in a matrix, the matrix has a rectangular cross section, the width of each via slit is equal to a total combined width of at least five via holes, and a height of each via slit is equal to a total combined length of at least one via hole.

2. The method of claim 1, wherein forming the metal plugs comprises feeding a tungsten source gas in the via holes.

3. The method of claim 1, further comprising, after forming the metal plugs:
    forming upper metal wiring over the second dielectric layer and electrically connected to the lower metal wiring via the metal plugs.

4. The method of claim 1, wherein each one of the via slits has a rectangular cross section.

5. The method of claim 2, wherein the tungsten source gas comprises $WF_6$.

6. A device comprising:
    a gate pattern formed over a semiconductor substrate;
    source/drain regions formed at opposite sides of the gate pattern;
    a dielectric layer formed over the semiconductor substrate including the gate pattern and the source/drain regions;
    a via pattern including a plurality of via holes penetrating through the dielectric layer and a plurality of via slits to space neighboring via holes apart from each other;
    metal plugs formed in the via holes connected to the gate pattern and the source/drain regions;
    metal wiring formed over the dielectric layer and electrically connected to the gate pattern and the source/drain regions via the metal plugs,
    wherein the plurality of via slits are arranged in a zigzag pattern such that the plurality of via slits alternate with each other,
    wherein the width of each via slit is equal to a total combined width of at least five via holes and a height of each via slit is equal to a total combined length of at least one via hole.

7. The device of claim 6, wherein the metal plugs are composed of a tungsten-base material.

8. The device of claim 6, wherein the tungsten-base material comprises $WF_6$.

9. The device of claim 6, wherein each one of the via slits has a rectangular cross section.

10. The device of claim 6, wherein the via pattern is formed in a matrix.

11. The device of claim 10, wherein the matrix comprises a rectangular matrix.

12. The device of claim 11, wherein the width of each via slit is equal to a total combined widths of at least five via holes and a height of each via slit is equal to a total combined length of at least via hole.

13. The device of claim 11, wherein via slits of neighboring rows in the matrix are arranged in the zigzag pattern.

14. The device of claim 11, wherein via slits of neighboring columns in the matrix are arranged in the zigzag pattern.

* * * * *